US008157001B2

(12) United States Patent
Hom et al.

(10) Patent No.: US 8,157,001 B2
(45) Date of Patent: Apr. 17, 2012

(54) INTEGRATED LIQUID TO AIR CONDUCTION MODULE

(75) Inventors: James Hom, Redwood City, CA (US); Girish Upadhya, Austin, TX (US); Douglas E. Werner, Santa Clara, CA (US); Mark Munch, Los Altos Hills, CA (US); Paul Tsao, Los Altos, CA (US); Bruce Conway, La Honda, CA (US); Peng Zhou, Albany, CA (US); Richard Brewer, Foster City, CA (US)

(73) Assignee: Cooligy Inc., Mountain View, CA (US)

( * ) Notice: Subject to any disclaimer, the term of this patent is extended or adjusted under 35 U.S.C. 154(b) by 260 days.

(21) Appl. No.: 11/731,484

(22) Filed: Mar. 30, 2007

(65) Prior Publication Data

US 2007/0227708 A1 Oct. 4, 2007

Related U.S. Application Data

(60) Provisional application No. 60/788,545, filed on Mar. 30, 2006.

(51) Int. Cl.
*G05D 23/00* (2006.01)
*F28F 7/00* (2006.01)
(52) U.S. Cl. ....... 165/299; 165/80.2; 165/165; 165/166; 165/167; 165/247; 165/300
(58) Field of Classification Search .......... 165/80.2, 165/80.3, 80.4, 104.32, 104.33, 133, 165, 165/166, 167, 247, 299, 300
See application file for complete search history.

(56) References Cited

U.S. PATENT DOCUMENTS

| 596,062 A | 12/1897 | Firey |
| 2,039,593 A | 5/1936 | Hubbuch et al. ............ 257/256 |
| 2,273,505 A | 2/1942 | Florian ......................... 138/28 |
| 3,361,195 A | 1/1968 | Meyerhoff et al. ............ 165/80 |

(Continued)

FOREIGN PATENT DOCUMENTS

DE 3314069 A 11/1986

(Continued)

OTHER PUBLICATIONS

Yongendra Joshi, "Heat out of small packages", Dec. 2001, Mechanical Engineer, pp. 56-58.

(Continued)

*Primary Examiner* — Ljiljana Ciric
(74) *Attorney, Agent, or Firm* — Haverstock & Owens LLP

(57) ABSTRACT

An integrated cooling system includes a first layer having a contact area configured for coupling to a heat source, wherein the first layer has a fluid path passes adjacent to the contact area where the heat source is in thermal contact with first layer. Coupled to the first layer is a second layer to which a number of air fins are attached. A pump is connected to the fluid path forming a closed path for circulating a fluid through the first layer. Within the first layer, the fluid path will contain a plurality of fluid fins which control the flow of a fluid within the fluid path. Within the fluid path, a structure providing a double-counter flow adjacent to one or more electronic devices. Additionally the fluid path can include a microchannel plate structure. The system can include a programmable controller connect the an air-mover, pump and temperature sensing device.

17 Claims, 6 Drawing Sheets

U.S. PATENT DOCUMENTS

| | | | |
|---|---|---|---|
| 3,491,184 A | 1/1970 | Rietdijk | |
| 3,524,497 A | 8/1970 | Chu et al. | 165/80 |
| 3,654,988 A | 4/1972 | Clayton, III | 165/17 |
| 3,662,821 A | 5/1972 | Saxon | |
| 3,771,219 A | 11/1973 | Tuzi et al. | 29/583 |
| 3,800,510 A | 4/1974 | Lamond | |
| 3,817,321 A | 6/1974 | von Cube et al. | 165/105 |
| 3,823,572 A | 7/1974 | Cochran, Jr. | 62/160 |
| 3,852,806 A | 12/1974 | Corman et al. | 357/82 |
| 3,923,426 A | 12/1975 | Theeuwes | 417/48 |
| 3,929,154 A | 12/1975 | Goodwin | 137/344 |
| 3,946,276 A | 3/1976 | Braun et al. | 317/100 |
| 3,948,316 A | 4/1976 | Souriau | 165/105 |
| 3,993,123 A | 11/1976 | Chu et al. | |
| RE29,513 E | 1/1978 | Johnson | |
| 4,109,707 A | 8/1978 | Wilson et al. | 165/46 |
| 4,194,559 A | 3/1980 | Eastman | 165/105 |
| 4,203,488 A | 5/1980 | Johnson et al. | 165/80 B |
| 4,211,208 A | 7/1980 | Lindner | 126/400 |
| 4,235,285 A | 11/1980 | Johnson et al. | 165/80 B |
| 4,248,295 A | 2/1981 | Ernst et al. | 165/105 |
| 4,296,455 A | 10/1981 | Leaycraft et al. | 361/383 |
| 4,312,012 A | 1/1982 | Frieser et al. | 357/82 |
| 4,332,291 A | 6/1982 | Mulock-Bentley | 165/76 |
| 4,345,267 A | 8/1982 | Corman et al. | 357/81 |
| 4,409,079 A | 10/1983 | Miyazaki et al. | |
| 4,450,472 A | 5/1984 | Tuckerman et al. | 357/82 |
| 4,467,861 A | 8/1984 | Kiseev et al. | 165/104.22 |
| 4,485,429 A | 11/1984 | Mittal | 361/386 |
| 4,494,171 A | 1/1985 | Bland et al. | 361/386 |
| 4,497,875 A | 2/1985 | Arakawa et al. | |
| 4,516,632 A | 5/1985 | Swift et al. | 165/167 |
| 4,540,115 A | 9/1985 | Hawrylo | 228/123 |
| 4,561,040 A | 12/1985 | Eastman et al. | 361/385 |
| 4,567,505 A | 1/1986 | Pease et al. | 357/81 |
| 4,573,067 A | 2/1986 | Tuckerman et al. | 357/82 |
| 4,574,876 A | 3/1986 | Aid | 165/46 |
| 4,612,979 A | 9/1986 | Heitzig | |
| 4,644,385 A | 2/1987 | Nakanishi et al. | 357/82 |
| 4,664,181 A | 5/1987 | Sumberg | 165/104.13 |
| 4,675,783 A | 6/1987 | Murase | 361/385 |
| 4,716,494 A | 12/1987 | Bright et al. | 361/386 |
| 4,758,926 A | 7/1988 | Herrell et al. | 361/385 |
| 4,791,983 A | 12/1988 | Nicol et al. | 165/80.4 |
| 4,793,405 A | 12/1988 | Diggelmann et al. | 165/104.33 |
| 4,866,570 A | 9/1989 | Porter | 361/382 |
| 4,868,712 A | 9/1989 | Woodman | 361/388 |
| 4,884,331 A | 12/1989 | Hinshaw | 29/558 |
| 4,893,174 A | 1/1990 | Yamada et al. | 357/82 |
| 4,894,709 A | 1/1990 | Phillips et al. | 357/82 |
| 4,896,719 A | 1/1990 | O'Neill et al. | 165/170 |
| 4,903,761 A | 2/1990 | Cima | 165/104.25 |
| 4,908,112 A | 3/1990 | Pace | 204/299 R |
| 4,938,280 A | 7/1990 | Clark | 165/80.4 |
| 4,978,638 A | 12/1990 | Buller et al. | 437/209 |
| 4,987,996 A | 1/1991 | Anderson | 206/321 |
| 5,009,760 A | 4/1991 | Zare et al. | 204/183.3 |
| 5,016,090 A | 5/1991 | Galyon et al. | 357/82 |
| 5,016,138 A | 5/1991 | Woodman | 361/381 |
| 5,016,707 A * | 5/1991 | Nguyen | 165/166 |
| 5,043,797 A | 8/1991 | Lopes | 357/82 |
| 5,057,908 A | 10/1991 | Weber | 357/81 |
| 5,058,627 A | 10/1991 | Brannen | 138/27 |
| 5,070,040 A | 12/1991 | Pankove | 437/209 |
| 5,083,194 A | 1/1992 | Bartilson | 357/81 |
| 5,088,005 A | 2/1992 | Ciaccio | 361/385 |
| 5,099,311 A | 3/1992 | Bonde et al. | 357/82 |
| 5,099,910 A | 3/1992 | Walpole et al. | 165/80.4 |
| 5,105,430 A | 4/1992 | Mundinger et al. | 372/35 |
| 5,125,451 A | 6/1992 | Matthews | 165/80.4 |
| 5,131,233 A | 7/1992 | Cray et al. | 62/64 |
| 5,145,001 A | 9/1992 | Valenzuela | 165/164 |
| 5,161,089 A | 11/1992 | Chu et al. | 361/385 |
| 5,179,500 A | 1/1993 | Koubek et al. | 361/385 |
| 5,199,487 A | 4/1993 | DiFrancesco et al. | 165/168 |
| 5,203,401 A | 4/1993 | Hamburgen et al. | 165/80.4 |
| 5,210,680 A | 5/1993 | Scheibler | |
| 5,218,515 A | 6/1993 | Bernhardt | 361/385 |
| 5,219,278 A | 6/1993 | Van Lintel | 417/413 R |
| 5,228,502 A | 7/1993 | Chu et al. | 165/80.4 |
| 5,230,564 A | 7/1993 | Bartilson et al. | 374/178 |
| 5,232,047 A | 8/1993 | Matthews | 165/168 |
| 5,239,200 A | 8/1993 | Messina et al. | 257/714 |
| 5,239,443 A | 8/1993 | Fahey et al. | 361/689 |
| 5,263,251 A | 11/1993 | Matthews | 29/840.036 |
| 5,265,670 A | 11/1993 | Zingher | 165/80.4 |
| 5,269,372 A | 12/1993 | Chu et al. | 165/80.4 |
| 5,274,920 A | 1/1994 | Mathews | 29/890.039 |
| 5,275,237 A | 1/1994 | Rolfson et al. | 165/80.5 |
| 5,281,026 A | 1/1994 | Bartilson et al. | 374/143 |
| 5,285,347 A | 2/1994 | Fox et al. | 361/385 |
| 5,299,635 A | 4/1994 | Abraham | 165/173 |
| 5,307,236 A | 4/1994 | Rio et al. | 361/720 |
| 5,308,429 A | 5/1994 | Bradley | 156/306.6 |
| 5,309,319 A | 5/1994 | Messina | 361/699 |
| 5,310,440 A | 5/1994 | Zingher | 156/345 |
| 5,316,077 A | 5/1994 | Reichard | 165/104.28 |
| 5,317,805 A | 6/1994 | Hoopman et al. | 29/890.03 |
| 5,325,265 A | 6/1994 | Turlik et al. | 361/702 |
| 5,336,062 A | 8/1994 | Richter | 417/413 A |
| 5,346,000 A | 9/1994 | Schlitt | 165/104.26 |
| 5,365,400 A | 11/1994 | Ashiwake et al. | 361/752 |
| 5,380,956 A | 1/1995 | Loo et al. | 174/252 |
| 5,383,340 A | 1/1995 | Larson et al. | 62/259.2 |
| 5,386,143 A | 1/1995 | Fitch | 257/715 |
| 5,388,635 A | 2/1995 | Gruber et al. | 165/80.4 |
| 5,397,919 A | 3/1995 | Tata et al. | 257/717 |
| 5,421,943 A | 6/1995 | Tam et al. | 156/273.9 |
| 5,424,918 A | 6/1995 | Felps et al. | 361/704 |
| 5,427,174 A | 6/1995 | Lomolino, Sr. et al. | 165/1 |
| 5,436,793 A | 7/1995 | Sanwo et al. | 361/689 |
| 5,459,099 A | 10/1995 | Hsu | 437/180 |
| 5,490,117 A | 2/1996 | Oda et al. | 365/226 |
| 5,508,234 A | 4/1996 | Dusablon, Sr. et al. | 437/228 |
| 5,514,832 A | 5/1996 | Dusablon, Sr. et al. | 174/15.1 |
| 5,514,906 A | 5/1996 | Love et al. | 257/712 |
| 5,520,244 A | 5/1996 | Mundinger et al. | 165/104.33 |
| 5,534,328 A | 7/1996 | Ashmead et al. | |
| 5,544,696 A | 8/1996 | Leland | 165/80.4 |
| 5,548,605 A | 8/1996 | Benett et al. | 372/36 |
| 5,564,497 A | 10/1996 | Fukuoka et al. | 165/152 |
| 5,575,929 A | 11/1996 | Yu et al. | 216/10 |
| 5,579,828 A | 12/1996 | Reed et al. | 165/83 |
| 5,585,069 A | 12/1996 | Zanzucchi et al. | 422/100 |
| 5,641,400 A | 6/1997 | Kaltenbach et al. | 210/198.2 |
| 5,646,824 A | 7/1997 | Osashi et al. | 361/699 |
| 5,647,429 A | 7/1997 | Oktay et al. | |
| 5,658,831 A | 8/1997 | Layton et al. | 29/832 |
| 5,675,473 A | 10/1997 | McDunn et al. | 361/699 |
| 5,676,198 A | 10/1997 | Schneider et al. | |
| 5,692,558 A | 12/1997 | Hamilton et al. | 165/80.4 |
| 5,696,405 A | 12/1997 | Weld | 257/714 |
| 5,703,536 A | 12/1997 | Davis et al. | 330/289 |
| 5,704,416 A | 1/1998 | Larson et al. | 165/104.33 |
| 5,718,628 A | 2/1998 | Nakazato et al. | |
| 5,726,495 A | 3/1998 | Aihara et al. | 257/722 |
| 5,727,618 A | 3/1998 | Mundinger et al. | 165/80.4 |
| 5,731,954 A | 3/1998 | Cheon | |
| 5,740,013 A | 4/1998 | Roesner et al. | 361/697 |
| 5,757,070 A | 5/1998 | Fritz | |
| 5,759,014 A | 6/1998 | Van Lintel | 417/413.3 |
| 5,763,951 A | 6/1998 | Hamilton et al. | 257/714 |
| 5,768,104 A | 6/1998 | Salmonson et al. | 361/704 |
| 5,796,580 A | 8/1998 | Komatsu et al. | 361/687 |
| 5,800,690 A | 9/1998 | Chow et al. | 204/451 |
| 5,801,442 A | 9/1998 | Hamilton et al. | 257/714 |
| 5,810,077 A | 9/1998 | Nakamura et al. | 165/153 |
| 5,811,062 A | 9/1998 | Wegeng et al. | 422/129 |
| 5,829,514 A | 11/1998 | Smith et al. | 165/78 |
| 5,830,806 A | 11/1998 | Hudson et al. | 438/690 |
| 5,835,345 A | 11/1998 | Staskus et al. | 361/699 |
| 5,836,750 A | 11/1998 | Cabuz | 417/322 |
| 5,847,452 A | 12/1998 | Tantoush | |
| 5,858,188 A | 1/1999 | Soane et al. | 204/454 |
| 5,862,038 A | 1/1999 | Suzuki et al. | |
| 5,863,708 A | 1/1999 | Zanzucchi et al. | 430/320 |
| 5,869,004 A | 2/1999 | Parce et al. | 422/100 |

| Patent No. | Date | Inventor | Class |
|---|---|---|---|
| 5,870,823 A | 2/1999 | Bezama et al. | 29/848 |
| 5,874,795 A | 2/1999 | Sakamoto | 310/156 |
| 5,876,655 A | 3/1999 | Fisher | 264/319 |
| 5,880,017 A | 3/1999 | Schwiebert et al. | 438/613 |
| 5,880,524 A | 3/1999 | Xie | 257/704 |
| 5,886,870 A | 3/1999 | Omori | 361/704 |
| 5,896,869 A | 4/1999 | Maniscalco et al. | |
| 5,898,572 A | 4/1999 | Shennib et al. | |
| 5,901,037 A | 5/1999 | Hamilton et al. | 361/699 |
| 5,918,469 A | 7/1999 | Cardella | 62/3.7 |
| 5,921,087 A | 7/1999 | Bhatia et al. | 62/3.2 |
| 5,923,086 A | 7/1999 | Winer et al. | 257/713 |
| 5,927,390 A | 7/1999 | Lehman | 165/122 |
| 5,936,192 A | 8/1999 | Tauchi | 136/203 |
| 5,940,270 A | 8/1999 | Puckett | 361/699 |
| 5,942,093 A | 8/1999 | Rakestraw et al. | 204/450 |
| 5,945,217 A | 8/1999 | Hanrahan | 428/389 |
| 5,957,194 A | 9/1999 | Azar | |
| 5,960,866 A | 10/1999 | Kimura et al. | 165/104.33 |
| 5,963,887 A | 10/1999 | Giorgio | |
| 5,964,092 A | 10/1999 | Tozuka et al. | 62/3.7 |
| 5,965,001 A | 10/1999 | Chow et al. | 204/600 |
| 5,965,813 A | 10/1999 | Wan et al. | 73/204.26 |
| 5,978,220 A | 11/1999 | Frey et al. | 361/699 |
| 5,993,750 A | 11/1999 | Ghosh et al. | 422/191 |
| 5,997,713 A | 12/1999 | Beetz, Jr. et al. | 205/124 |
| 5,998,240 A | 12/1999 | Hamilton et al. | 438/122 |
| 6,007,309 A | 12/1999 | Hartley | 417/322 |
| 6,010,316 A | 1/2000 | Haller et al. | 417/322 |
| 6,012,902 A | 1/2000 | Parce | |
| 6,013,164 A | 1/2000 | Paul et al. | 204/450 |
| 6,014,312 A | 1/2000 | Schulz-Harder et al. | 361/699 |
| 6,019,165 A | 2/2000 | Batchelder | 165/80.3 |
| 6,019,882 A | 2/2000 | Paul et al. | 204/450 |
| 6,021,045 A | 2/2000 | Johnson | 361/704 |
| 6,031,751 A | 2/2000 | Janko | |
| 6,034,872 A | 3/2000 | Chrysler et al. | 361/699 |
| 6,039,114 A | 3/2000 | Becker et al. | 165/170 |
| 6,049,040 A | 4/2000 | Biles et al. | 174/68.3 |
| 6,054,034 A | 4/2000 | Soane et al. | 204/601 |
| 6,068,752 A | 5/2000 | Dubrow et al. | 204/604 |
| 6,084,178 A | 7/2000 | Cromwell | 174/35 |
| 6,086,330 A | 7/2000 | Press et al. | 416/223 |
| 6,090,251 A | 7/2000 | Sundberg et al. | 204/453 |
| 6,096,656 A | 8/2000 | Matzke et al. | 438/702 |
| 6,100,541 A | 8/2000 | Nagle et al. | 250/573 |
| 6,101,715 A | 8/2000 | Fuesser et al. | 29/890.03 |
| 6,119,729 A | 9/2000 | Oberholzer et al. | 138/27 |
| 6,126,723 A | 10/2000 | Drost et al. | 96/4 |
| 6,129,145 A | 10/2000 | Yamamoto et al. | 165/168 |
| 6,129,260 A | 10/2000 | Andrus et al. | 228/120 |
| 6,131,650 A | 10/2000 | North et al. | 165/170 |
| 6,140,860 A | 10/2000 | Sandhu et al. | 327/513 |
| 6,146,103 A | 11/2000 | Lee et al. | 417/50 |
| 6,154,363 A | 11/2000 | Chang | 361/699 |
| 6,159,353 A | 12/2000 | West et al. | 204/601 |
| 6,163,073 A | 12/2000 | Patel | 257/712 |
| 6,166,907 A | 12/2000 | Chien | |
| 6,167,948 B1 | 1/2001 | Thomas | 165/104.26 |
| 6,171,067 B1 | 1/2001 | Parce | 417/48 |
| 6,174,675 B1 | 1/2001 | Chow et al. | 435/6 |
| 6,176,962 B1 | 1/2001 | Soane et al. | 156/292 |
| 6,182,742 B1 | 2/2001 | Tanahashi et al. | 165/104.33 |
| 6,186,660 B1 | 2/2001 | Kopf-Sill et al. | 366/340 |
| 6,196,307 B1 | 3/2001 | Ozmat | 165/185 |
| 6,206,022 B1 | 3/2001 | Tsai et al. | 137/15.18 |
| 6,210,986 B1 | 4/2001 | Arnold et al. | 438/42 |
| 6,216,343 B1 | 4/2001 | Leland et al. | 29/890.032 |
| 6,221,226 B1 | 4/2001 | Kopf-Sill | 204/602 |
| 6,227,287 B1 | 5/2001 | Tanaka et al. | 165/80.4 |
| 6,227,809 B1 | 5/2001 | Forster et al. | 417/53 |
| 6,234,240 B1 | 5/2001 | Cheon | 165/80.3 |
| 6,238,538 B1 | 5/2001 | Parce et al. | 204/600 |
| 6,253,832 B1 | 7/2001 | Hallefalt | 164/502 |
| 6,253,835 B1 | 7/2001 | Chu et al. | 165/80.4 |
| 6,257,320 B1 | 7/2001 | Wargo | 165/80.4 |
| 6,277,257 B1 | 8/2001 | Paul et al. | 204/450 |
| 6,287,440 B1 | 9/2001 | Arnold et al. | 204/450 |
| 6,293,333 B1 | 9/2001 | Ponnappan et al. | |
| 6,301,109 B1 | 10/2001 | Chu et al. | 361/690 |
| 6,313,992 B1 | 11/2001 | Hildebrandt | 361/700 |
| 6,317,326 B1 | 11/2001 | Vogel et al. | 361/704 |
| 6,321,791 B1 | 11/2001 | Chow | 137/833 |
| 6,322,753 B1 | 11/2001 | Lindberg et al. | 422/102 |
| 6,324,058 B1 | 11/2001 | Hsiao | 361/699 |
| 6,324,075 B1 | 11/2001 | Unrein et al. | 361/816 |
| 6,330,907 B1 | 12/2001 | Ogushi et al. | 165/104.26 |
| 6,336,497 B1 | 1/2002 | Lin | 165/80.3 |
| 6,337,794 B1 | 1/2002 | Agonafer et al. | 361/690 |
| 6,347,036 B1 | 2/2002 | Yeager et al. | 361/687 |
| 6,351,384 B1 | 2/2002 | Daikoku et al. | 361/704 |
| 6,355,505 B1 | 3/2002 | Maeda et al. | |
| 6,362,958 B1 | 3/2002 | Yu et al. | |
| 6,366,462 B1 | 4/2002 | Chu et al. | 361/699 |
| 6,366,467 B1 | 4/2002 | Patel et al. | 361/760 |
| 6,367,544 B1 | 4/2002 | Calaman | 165/135 |
| 6,385,044 B1 | 5/2002 | Colbert et al. | 361/700 |
| 6,388,317 B1 | 5/2002 | Reese | 257/713 |
| 6,396,706 B1 | 5/2002 | Wohlfarth | 361/760 |
| 6,397,932 B1 | 6/2002 | Calaman et al. | 165/80.4 |
| 6,400,012 B1 | 6/2002 | Miller et al. | 257/712 |
| 6,406,605 B1 | 6/2002 | Moles | 204/601 |
| 6,415,860 B1 | 7/2002 | Kelly et al. | 165/748 |
| 6,416,642 B1 | 7/2002 | Alajoki et al. | 204/451 |
| 6,417,060 B2 | 7/2002 | Tavkhelidze et al. | 438/380 |
| 6,424,531 B1 | 7/2002 | Bhatti et al. | 361/704 |
| 6,431,260 B1 | 8/2002 | Agonafer et al. | 165/80.4 |
| 6,437,981 B1 | 8/2002 | Newton et al. | 361/700 |
| 6,438,894 B1 | 8/2002 | Silvandersson et al. | 43/114 |
| 6,438,984 B1 | 8/2002 | Novotny et al. | 62/259.2 |
| 6,443,222 B1 | 9/2002 | Yun et al. | 165/104.26 |
| 6,444,461 B1 | 9/2002 | Knapp et al. | 435/283.1 |
| 6,449,157 B1 | 9/2002 | Chu | 361/704 |
| 6,449,162 B1 | 9/2002 | Corbin, Jr. et al. | 361/719 |
| 6,457,515 B1 | 10/2002 | Vafai et al. | 165/80.4 |
| 6,459,581 B1 | 10/2002 | Newton et al. | 361/700 |
| 6,459,582 B1 | 10/2002 | Ali et al. | 361/704 |
| 6,466,442 B2 | 10/2002 | Lin | 361/695 |
| 6,469,893 B1 | 10/2002 | Frutschy et al. | 361/700 |
| 6,477,045 B1 | 11/2002 | Wang | 361/700 |
| 6,492,200 B1 | 12/2002 | Park et al. | 438/113 |
| 6,493,221 B2 | 12/2002 | Harrison et al. | |
| 6,495,015 B1 | 12/2002 | Schoeniger et al. | 204/600 |
| 6,508,301 B2 | 1/2003 | Marsala | 165/80.4 |
| 6,519,148 B2 | 2/2003 | Nakagawa et al. | |
| 6,519,151 B2 | 2/2003 | Chu et al. | 361/699 |
| 6,527,835 B1 | 3/2003 | Manginell et al. | 96/102 |
| 6,533,029 B1 | 3/2003 | Phillips | 165/104.26 |
| 6,533,840 B2 | 3/2003 | Martin et al. | |
| 6,536,516 B2 | 3/2003 | Davies et al. | 165/170 |
| 6,537,437 B1 | 3/2003 | Galambos et al. | 204/600 |
| 6,543,521 B1 | 4/2003 | Sato et al. | 165/80.3 |
| 6,553,253 B1 | 4/2003 | Chang | 604/20 |
| 6,572,749 B1 | 6/2003 | Paul et al. | 204/450 |
| 6,577,045 B1 | 6/2003 | Blyablin et al. | 313/311 |
| 6,578,626 B1 | 6/2003 | Calaman et al. | 165/80.4 |
| 6,581,388 B2 | 6/2003 | Novotny et al. | 62/3.7 |
| 6,587,343 B2 | 7/2003 | Novotny et al. | 361/698 |
| 6,588,498 B1 | 7/2003 | Reyzin et al. | 165/104.33 |
| 6,591,625 B1 | 7/2003 | Simon | 62/259.2 |
| 6,600,220 B2 | 7/2003 | Barber et al. | 257/685 |
| 6,601,643 B2 | 8/2003 | Cho et al. | 165/104.26 |
| 6,606,251 B1 | 8/2003 | Kenny et al. | 361/764 |
| 6,609,560 B2 | 8/2003 | Cho et al. | 165/104.26 |
| 6,632,655 B1 | 10/2003 | Mehta et al. | 435/288.5 |
| 6,632,719 B1 | 10/2003 | DeBoer et al. | 438/381 |
| 6,639,799 B2 | 10/2003 | Prasher et al. | |
| 6,643,132 B2 | 11/2003 | Faneuf et al. | 361/700 |
| 6,651,452 B2 | 11/2003 | Lecke et al. | |
| 6,651,735 B2 | 11/2003 | Cho et al. | 165/104.26 |
| 6,657,860 B2 | 12/2003 | Matsui et al. | |
| 6,674,642 B1 | 1/2004 | Chu et al. | 361/687 |
| 6,678,168 B2 | 1/2004 | Kenny, Jr. et al. | |
| 6,700,785 B2 | 3/2004 | Berry et al. | 361/726 |
| 6,729,383 B1 | 5/2004 | Cannell et al. | 165/80.3 |
| 6,743,664 B2 | 6/2004 | Liang et al. | 438/124 |
| 6,757,169 B2 | 6/2004 | Kondo et al. | 361/699 |
| 6,763,880 B1 | 7/2004 | Shih | 165/80.4 |

| Patent No. | Date | Name | Ref |
|---|---|---|---|
| 6,775,137 B2 | 8/2004 | Chu et al. | |
| 6,787,052 B1 | 9/2004 | Vaganov | |
| 6,795,312 B2 | 9/2004 | Narakino et al. | 361/687 |
| 6,796,372 B2 | 9/2004 | Bear | 165/104.21 |
| 6,819,563 B1 | 11/2004 | Chu et al. | |
| 6,826,922 B2 | 12/2004 | Patel et al. | 62/185 |
| 6,863,117 B2 | 3/2005 | Valenzuela | |
| 6,881,039 B2 | 4/2005 | Corbin et al. | |
| 6,882,543 B2 | 4/2005 | Kenny et al. | 361/764 |
| 6,896,612 B1 | 5/2005 | Novotny | |
| 6,903,929 B2 | 6/2005 | Prasher et al. | 361/699 |
| 6,914,779 B2 | 7/2005 | Askeland et al. | |
| 6,924,981 B2 | 8/2005 | Chu et al. | |
| 6,950,303 B2 | 9/2005 | Neho et al. | |
| 6,955,212 B1 | 10/2005 | Hsieh | |
| 6,973,801 B1* | 12/2005 | Campbell et al. | 165/104.32 |
| 6,986,382 B2 | 1/2006 | Upadhya et al. | 165/80.4 |
| 6,988,534 B2 | 1/2006 | Kenny et al. | 165/80.4 |
| 6,988,535 B2 | 1/2006 | Upadhya et al. | |
| 6,992,891 B2 | 1/2006 | Mallik et al. | 361/704 |
| 6,994,151 B2 | 2/2006 | Zhou et al. | |
| 7,000,684 B2* | 2/2006 | Kenny et al. | 165/104.33 |
| 7,009,843 B2 | 3/2006 | Lee et al. | 361/704 |
| 7,017,654 B2 | 3/2006 | Kenny et al. | |
| 7,018,169 B2 | 3/2006 | Phillip et al. | |
| 7,019,972 B2 | 3/2006 | Kenny, Jr. et al. | |
| 7,021,369 B2 | 4/2006 | Werner et al. | 165/104.33 |
| 7,044,196 B2 | 5/2006 | Shook et al. | |
| 7,050,308 B2 | 5/2006 | Kenny, Jr. et al. | |
| 7,051,802 B2 | 5/2006 | Baer | |
| 7,052,751 B2 | 5/2006 | Smith et al. | 428/35.9 |
| 7,061,104 B2 | 6/2006 | Kenny, Jr. et al. | |
| 7,077,634 B2 | 7/2006 | Munch et al. | |
| 7,078,615 B2 | 7/2006 | Gladfelter et al. | 174/36 |
| 7,086,839 B2 | 8/2006 | Kenny et al. | |
| 7,090,001 B2 | 8/2006 | Zhou et al. | |
| 7,104,312 B2 | 9/2006 | Goodson et al. | |
| 7,112,131 B2 | 9/2006 | Rasmussen et al. | |
| 7,117,931 B2 | 10/2006 | Crocker et al. | 165/104.33 |
| 7,124,811 B2 | 10/2006 | Crocker et al. | 165/104.33 |
| 7,143,816 B1 | 12/2006 | Ghosh et al. | |
| 7,143,820 B2 | 12/2006 | Crocker et al. | 165/104.33 |
| 7,154,037 B2 | 12/2006 | Brenner et al. | 174/21 |
| 7,156,159 B2 | 1/2007 | Lovette et al. | |
| 7,178,512 B1 | 2/2007 | Merten | |
| 7,188,662 B2 | 3/2007 | Brewer et al. | |
| 7,190,583 B1 | 3/2007 | Fendley et al. | |
| 7,201,012 B2 | 4/2007 | Munch et al. | |
| 7,201,214 B2 | 4/2007 | Munch et al. | |
| 7,221,858 B2 | 5/2007 | Ku | |
| 7,228,888 B2 | 6/2007 | Eckberg et al. | 165/80.4 |
| 7,233,494 B2 | 6/2007 | Campbell et al. | |
| 7,243,704 B2 | 7/2007 | Tustaniwskyi et al. | 165/80 |
| 7,278,549 B2 | 10/2007 | Munch et al. | |
| 7,280,363 B2 | 10/2007 | Reyzin et al. | 361/719 |
| 7,293,423 B2 | 11/2007 | Upadhya et al. | |
| 7,295,444 B1 | 11/2007 | Wang | |
| 7,301,773 B2 | 11/2007 | Brewer et al. | 361/719 |
| 7,325,588 B2 | 2/2008 | Malone et al. | |
| 7,334,630 B2 | 2/2008 | Goodson et al. | 165/104.33 |
| 7,342,789 B2 | 3/2008 | Hall et al. | |
| 7,344,363 B2 | 3/2008 | Munch et al. | |
| 7,355,850 B2 | 4/2008 | Baldwin, Jr. | |
| 7,382,613 B2 | 6/2008 | Vinson et al. | |
| 7,385,810 B2 | 6/2008 | Chu et al. | |
| 7,402,029 B2 | 7/2008 | Munch et al. | |
| 7,420,806 B2 | 9/2008 | Lima et al. | |
| 7,430,118 B1 | 9/2008 | Noteboom et al. | |
| 7,434,412 B1 | 10/2008 | Miyahira | |
| 7,449,122 B2 | 11/2008 | Corbin et al. | |
| 7,455,103 B2 | 11/2008 | Sato et al. | |
| 7,462,852 B2 | 12/2008 | Appleby et al. | |
| 7,539,020 B2 | 5/2009 | Chow et al. | |
| 7,591,302 B1* | 9/2009 | Lenehan et al. | 165/247 |
| 7,666,215 B2* | 2/2010 | Callister et al. | 607/105 |
| 2001/0024820 A1 | 9/2001 | Mastromatteo et al. | 435/287.2 |
| 2001/0042616 A1 | 11/2001 | Baer | |
| 2001/0044155 A1 | 11/2001 | Paul et al. | 436/161 |
| 2001/0045270 A1 | 11/2001 | Bhatti et al. | 165/80.3 |
| 2001/0046703 A1 | 11/2001 | Burns et al. | 435/303.1 |
| 2001/0055714 A1 | 12/2001 | Cettour-Rose et al. | 429/122 |
| 2002/0011330 A1* | 1/2002 | Insley et al. | 165/133 |
| 2002/0031948 A1 | 3/2002 | Yasufuku et al. | 439/625 |
| 2002/0051341 A1 | 5/2002 | Frutschy et al. | 361/700 |
| 2002/0075645 A1 | 6/2002 | Kitano et al. | 361/687 |
| 2002/0121105 A1 | 9/2002 | McCarthy, Jr. et al. | 62/500 |
| 2003/0077474 A1 | 4/2003 | Rabinkin et al. | |
| 2003/0121274 A1 | 7/2003 | Wightman | 62/222 |
| 2003/0123228 A1 | 7/2003 | Bhatia et al. | 361/705 |
| 2003/0128508 A1 | 7/2003 | Faneuf et al. | |
| 2003/0205363 A1 | 11/2003 | Chu et al. | |
| 2003/0213580 A1 | 11/2003 | Philpott et al. | 165/46 |
| 2004/0008483 A1 | 1/2004 | Cheon | |
| 2004/0012927 A1 | 1/2004 | Lee et al. | |
| 2004/0040695 A1 | 3/2004 | Chesser et al. | 165/104.21 |
| 2004/0050538 A1 | 3/2004 | Sunder et al. | |
| 2004/0052049 A1 | 3/2004 | Wu et al. | 361/699 |
| 2004/0070935 A1 | 4/2004 | Tomioka et al. | |
| 2004/0089008 A1 | 5/2004 | Tilton et al. | 62/259.2 |
| 2004/0099410 A1 | 5/2004 | Ghosh | 165/185 |
| 2004/0105234 A1 | 6/2004 | Messina et al. | |
| 2004/0112585 A1 | 6/2004 | Goodson et al. | 165/299 |
| 2004/0125561 A1 | 7/2004 | Gwin et al. | 361/699 |
| 2004/0126863 A1 | 7/2004 | Fidock et al. | 435/196 |
| 2004/0160741 A1 | 8/2004 | Moss et al. | 361/699 |
| 2004/0188059 A1 | 9/2004 | Todd, Jr. et al. | |
| 2004/0188069 A1 | 9/2004 | Tomioka et al. | 165/104.33 |
| 2004/0188076 A1 | 9/2004 | Lee | 165/174 |
| 2004/0206477 A1 | 10/2004 | Kenny et al. | 165/80.4 |
| 2004/0207986 A1 | 10/2004 | Rubenstein | |
| 2004/0221603 A1 | 11/2004 | Arik et al. | |
| 2004/0221604 A1 | 11/2004 | Ota et al. | 62/259.2 |
| 2004/0228091 A1 | 11/2004 | Miyairi | |
| 2005/0024832 A1 | 2/2005 | Lee et al. | |
| 2005/0029242 A1 | 2/2005 | Bonnet et al. | |
| 2005/0041393 A1 | 2/2005 | Tustaniwskyi et al. | |
| 2005/0061013 A1 | 3/2005 | Bond | |
| 2005/0082666 A1 | 4/2005 | Lee et al. | 257/728 |
| 2005/0083657 A1 | 4/2005 | Hamman | 361/699 |
| 2005/0117298 A1 | 6/2005 | Koga et al. | 361/699 |
| 2005/0133200 A1 | 6/2005 | Malone et al. | 165/80.4 |
| 2005/0174737 A1 | 8/2005 | Meir | |
| 2005/0243516 A1 | 11/2005 | Stefanoski et al. | |
| 2005/0247433 A1 | 11/2005 | Corrado et al. | 165/80.4 |
| 2005/0257532 A1 | 11/2005 | Ikeda et al. | 62/3.7 |
| 2005/0259393 A1 | 11/2005 | Vinson et al. | 361/690 |
| 2005/0270742 A1 | 12/2005 | Brewer et al. | 361/696 |
| 2006/0023422 A1 | 2/2006 | Shum et al. | 361/695 |
| 2006/0037739 A1 | 2/2006 | Utsunomiya | 165/104.33 |
| 2006/0056156 A1 | 3/2006 | Long et al. | 361/704 |
| 2006/0102322 A1 | 5/2006 | Tustaniwskyi et al. | 257/688 |
| 2006/0133039 A1 | 6/2006 | Belady | 361/699 |
| 2006/0137863 A1 | 6/2006 | Lee et al. | 165/104.33 |
| 2006/0139882 A1 | 6/2006 | Mikubo et al. | 361/699 |
| 2006/0187639 A1 | 8/2006 | Carswell | 361/699 |
| 2006/0232945 A1 | 10/2006 | Chu et al. | |
| 2006/0245987 A1 | 11/2006 | Schmidt | |
| 2007/0039719 A1 | 2/2007 | Eriksen | |
| 2007/0042514 A1 | 2/2007 | Wu et al. | 438/17 |
| 2007/0109739 A1 | 5/2007 | Stefanoski | |
| 2007/0115634 A1 | 5/2007 | Laing | 361/699 |
| 2007/0152352 A1 | 7/2007 | McKinnell et al. | |
| 2007/0164088 A1 | 7/2007 | Dianatkhah | |
| 2007/0201210 A1 | 8/2007 | Chow et al. | |
| 2007/0211428 A1 | 9/2007 | Doll | |
| 2007/0227708 A1 | 10/2007 | Hom et al. | |
| 2007/0235167 A1 | 10/2007 | Brewer et al. | |
| 2007/0266714 A1 | 11/2007 | Fielder | |
| 2007/0297136 A1 | 12/2007 | Konshak | |
| 2008/0013283 A1 | 1/2008 | Gilbert et al. | 361/715 |
| 2008/0018212 A1 | 1/2008 | Spearing et al. | |
| 2008/0023180 A1 | 1/2008 | Bunker et al. | |
| 2008/0110963 A1 | 5/2008 | Lin et al. | |
| 2008/0205003 A1 | 8/2008 | Belady | |
| 2008/0285228 A1 | 11/2008 | Koch et al. | |
| 2011/0073292 A1 | 3/2011 | Datta et al. | |

FOREIGN PATENT DOCUMENTS

| | | | |
|---|---|---|---|
| DE | 3927755 A1 | 2/1991 | |
| DE | 19628548 A1 | 1/1998 | |
| DE | 29717480 U1 | 2/1998 | |
| DE | 197 15 001 A1 | 12/1998 | |
| DE | 69413012 T2 | 3/1999 | |
| DE | 69511875 T2 | 3/2000 | |
| DE | 10141525 A1 | 3/2003 | |
| DE | 10319367 A1 | 11/2004 | |
| DE | 102004042154 A1 | 3/2006 | |
| EP | 0 520 173 A2 | 12/1992 | |
| EP | 0720720 B1 | 1/1998 | |
| EP | 0845728 A2 | 3/1998 | |
| EP | 1 520 993 A2 | 6/2005 | |
| JP | 60046056 | 12/1985 | |
| JP | 64-024447 | 1/1989 | |
| JP | 6-326226 | 11/1994 | |
| JP | 9-102568 | 4/1997 | |
| JP | 10-099592 | 4/1998 | |
| JP | 10223811 | 8/1998 | |
| JP | 2001-326311 | 11/2001 | |
| JP | 306614 | 3/2005 | |
| TW | 183247 | 5/1995 | |
| TW | 402680 | 9/2000 | |
| TW | 449040 | 8/2001 | |
| TW | 491931 | 6/2002 | |
| TW | 502102 | 9/2002 | |
| TW | 0502102 | 9/2002 | |
| TW | 516810 | 1/2003 | |
| TW | 0306614 | 2/2007 | |
| WO | 02081996 A2 | 10/2002 | |
| WO | 2005080901 A1 | 9/2005 | |
| WO | 2007006590 A2 | 1/2007 | |

OTHER PUBLICATIONS

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", 1995, IEEE Transactions on Components, Packaging, and Manufacturing Technology—Part A, vol. 18, No. 4, pp. 795-804.

Jerry K. Keska Ph. D. et al., "An Experimental Study on an Enhanced Microchannel Heat Sink for Microelectronics Applications", EEP—vol. 26-2, Advances in Electronic Packaging, 1999, vol. 2, pp. 1235-1259.

A. J. Arnold et al., "Heat Sink Design for Cooling Modules in a Forced Air Environment", IBM Technical Disclosure Bulletin, vol. 22, No. 6, Nov. 1979, pp. 2297-2298.

"Forced Boiling Cooling System with Jet Enhancement for Crititical Heat Flux Extension", IBM Technical Disclosure Bulletin, vol. 39, No. 10, Oct. 1996, p. 143.

"Self-Contained Active Heat Dissipation Device", IBM Technical Disclosure Bulletin vol. 39, No. 04, Apr. 1996, pp. 115-116.

"Pin Fin Array Heat Pipe Apparatus", IBM Technical Disclosure Bulletin, vol. 37, No. 09, Sep. 1994, p. 171.

Mali Mahalingam, *Thermal Management in Semiconductor Device Packaging*, 1985, Proceedings of the IEEE, vol. 73, No. 9, Sep. 1985, pp. 1396-1404.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754-760.

Plattenwarmeubertrager, Die Bibliothek der Technik 105, published by "moderne industrie", 3$^{rd}$ edition, 2000, ISBN 3-478-93119-3, pp. 34-36.

"*Means of Removing More Heat from a TCM (or other Liquid-Cooled Logic Package) by Reducing the Coolant Temperature*", IBM Technical Disclosure Bulletin, vol. 32, No. 5A, Oct. 1989, IBM Corp. 1989, pp. 153-154.

"*Cold Plate for Thermal Conduction Module with Improved Flow Pattern and Flexible Base*", IBM Technical Disclosure Bulletin, vol. 25, No. 9, Feb. 1983, IBM Corp. 1989, p. 4517.

"*Structure for the Removal of Heat from an Integrated Circuit Module*", IBM Technical Disclosure Bulletin, vol. 22, No. 6, Nov. 1979, IBM Corp. 1979, pp. 2294-2296.

"*Optimal Thermal Design of Air Cooled Forced Convection Finned Heat Sinks—Experimental Verification*", this paper appears in Components, Hybrids, and Manufacturing Technology, IEEE Transactions, R.W. Knight et al., Publication date: Oct. 1992, vol. 15, Issue 5, pp. 754-760, , Current Version Published Aug. 6, 2002.

"*High Performance Forced Air Cooling Scheme Employing Microchannel Heat Exchangers*", paper appears in Components, Packaging, and Manufacturing Technology, Part A, IEEE Transactions , M.B. Kleiner et al., Publication date: Dec. 1995, vol. 18, Issue 4, pp. 795-804, Current Version Published Aug. 6, 2002.

"*Heat Sink Design for Cooling Modules in a Forced Air Environment*", A.J. Arnold et al., IBM Technical Disclosure Bulletin, vol. 22, No. 6, Nov. 1979, IBM Corp. 1979, pp. 2297-2298.

"*Heat Out of Small Packages*", Compact Cooling Devices are Taking Shape to Deal with the Next Generation of Ever-Hotter Computer Chips, by Yogendra Joshi, Mechanical Engineering, findarticles.com, Dec. 2001, pp. 56-58.

"*Convection Cooling of MicroElectronic Chips*", S. Konecni et al., this paper appears in Thermal Phenomena in Electronic Systems, 1992., I-Therm III, InterSociety, Publication Date: Feb. 5, 1992, University of Texas at Arlington, Arlington, Texas 76019, pp. 138-144, Current Version Published Aug. 6, 2002.

"*An Experimental Study on an Enhanced Microchannel Heat Sink for Microelectronics Applications*", Jerry K. Keska Ph.D et al.,Saint Martins College, Turnwater, Wa., EEP—vol. 26-2, Advances in Electronic Packaging—1999, vol. 2, ASME 1999, pp. 1235-1259.

"*Self Contained Active Heat Dissipation Device*", IBM Technical Disclosure Bulletin, vol. 39, No. 4, Apr. 1996, pp. 115-116.

"*Pin Fin Array Heat Pipe Apparatus*", IBM Technical Disclosure Bulletin, vol. 37, No. 9, Sep. 1994, p. 171.

"*Thermal Managementin Semiconductor Device Packaging*", Mali Mahalingham, this paper appears in Proceedings of the IEEE, Publication Date: Sep. 1985, vol. 73, Issue 9pp. 1396-1404, current version published Jun. 28, 2005.

*Plattenwarmeubertrager, Die Bibliothek der Technik* 105, published by moderne industrie , 3$^{rd}$ edition, 2000, ISBN 3-478-93119-3, API Schmidt-Bretten, pp. 34-36.

An Official Action dated Mar. 26, 2010, regarding German Patent Application No. 11 2007 000 768.0-34, 20 pages.

"Means of Removing More Heat from a TCM (or other Liquid-Cooled Logic Package )by Reducing the Coolant Temperature", IBM Technical Disclosure Bulletin, vol. 32, No. 5A, Oct. 1989, pp. 153-154.

"Cold Plate for Thermal Conduction Module with Improved Flow Pattern and Flexible Base", IBM Technical Disclosure Bulletin, vol. 25, No. 9, Feb. 1983, p. 4517.

"Structure for the Removal of Heat from an Integrated Circuit Module", IBM Technical Disclosure Bulletin, vol. 22, No. 6, Nov. 1979, pp. 2294-2296.

"Optimal Thermal Design of Air Cooled Forced Convection Finned Heat Seat Sinks—Experimental Verification", Roy W. Knight et al., IEEE Transactions on Components, Hybrids, and Manufacturing Technology, vol. 15, No. 5, Oct. 1992, pp. 754-760.

"High Performance Forced Air Cooling Scheme Employing Microchannel Heat Exchangers", Michael B. Kleiner et al., IEEE Transactions on Components, Packaging, and Manufacturing Technology, Part A., vol. 18, No. 4, Dec. 1995, pp. 795-804.

"Heat Sink Design for Cooling Modules in a Forced Air Environment", A. J. Arnold et al., IBM Technical Disclosure Bulletin , vol. 22, No. 6, Nov. 1979, pp. 2297-2298.

English Translation of the Office Action (issued to Patent Application No. 093106097), 5 pages.

\* cited by examiner

INTEGRATED LIQUID TO AIR CONDUCTION MODULE

RELATED APPLICATIONS

This patent application claims priority under 35 U.S.C. 119 (e) of U.S. Provisional Patent Application Ser. No. 60/788,545 filed Mar. 30, 2006, and entitled "MULTI CHIP COOLING". The Provisional Patent Application Ser. No. 60/788,545 filed Mar. 30, 2006, and entitled "MULTI CHIP COOLING" is also hereby incorporated by reference.

FIELD OF THE INVENTION

This invention relates generally to heat exchangers. More specifically, the present invention relates to methods of and systems for cooling multi-chip using a combination of liquid and air cooling structures.

BACKGROUND OF THE INVENTION

Cooling current semiconductor structures presents significant challenges for traditional cooling structures, such as fan-mounted heat sinks and heat pipes. For instance, modern high performance processors have very high heat dissipation requirements, but traditional cooling structures cannot satisfy these requirements. Fan-mounted heat sinks often do not move sufficient air quickly enough to cool a modern processor. Similarly, heat pipes are limited in both the amount of heat they can dissipate and the distance they can move the heat from the heat source. Hence, conventional cooling techniques that use heat pipes or fan-mounted heat sinks are not adequate for cooling modern electronics.

These limitations are even more apparent with systems that incorporate multiple electronic components, each generating heat. For example, high performance laptops are increasingly used as replacements for desktop systems. These laptops integrate on a small footprint many electronics components such as CPUs, graphics processors, and memory hub controllers. System-level and component-level cooling solutions each has its drawbacks.

System-level solutions are sub-optimal because any solution optimized for one system is necessarily sub-optimal for another system. Cooling solutions addressing cooling on an individual component basis decreases the system reliability by requiring additional critical components, joints, and connections, failure of any one of which could cause a system failure.

SUMMARY OF THE INVENTION

Embodiments of the present invention provide more efficient cooling of systems that contain multiple heat-generating electronic devices. In a first aspect of the present invention, an integrated cooling system includes a first cooling structure stacked on top of a second cooling structure. The first cooling structure is for circulating a first cooling medium, and the second cooling structure is for circulating a second cooling medium different from the first medium. In one embodiment, the system includes a fluid path in the first cooling structure. The fluid path contains a microchannel structure. Preferably, the first cooling medium is water and the second cooling medium is air.

Preferably, the fluid path includes a double-counter structure. The double-counter structure is a multi-pass flow structure with the predominant flow path counter to that of the flow in the second medium. The purpose of the multi-pass flow structure is spread the heat over a larger area and to maximize the time during which the fluid is flowing under the air fins and transferring heat. In one embodiment, the system also includes a pump coupled to the fluid path.

In a second aspect of the invention, an integrated cooling system includes a first layer, a second layer, and a pump. The first layer is coupled to the second layer. The first layer has a contact area configured for coupling to a heat source and has a fluid path adjacent to the contact area. The second layer has a plurality of air fins. The pump is coupled to the fluid path and forms a closed path for circulating a fluid through the first layer.

Preferably, the second layer seals to the first layer to provide an inner surface of the fluid path. In one embodiment, the fluid path has a fluid contact area with the second layer that is greater than two times the contact area of the first layer with the heat source. Preferably, the first layer and the second layer both have a thermal conductivity of at least 15 W/(mK) or greater.

In one embodiment, the fluid path contains a plurality of fluid fins that are substantially equally spaced over the contact area. Preferably, the fluid fins have a thermal conductivity of 15 W/(mK) or greater and are evenly spaced.

Preferably, the system includes a heat source coupled to the contact area. The heat source can include one or more electronic devices. The fluid path includes a double-counter structure. In some embodiments, the system includes a programmable controller coupled to a temperature-sensing element within the fluid path. The programmable controller is programmed to increase a fluid flow rate within the fluid path when the temperature-sensing element detects an increase in temperature. Alternatively, or additionally, the programmable controller is programmed to increase the air-mover speed when the detected temperature increases and decrease the air-mover speed when the temperature decreases.

In one embodiment, the direction of fluid pumping from the inlet to the outlet where the fluid has cooled the more before reaching the pump. Typically, this fluid flow direction is where the flow-path distance is the longest from a port and the highest dissipation heat source.

In another embodiment, the system also includes a fluid reservoir coupled to or within the fluid path, preferably coupled to the pump.

Preferably, the first layer includes an enclosure that forms at least one airflow channel and at least one air-mover coupled to at least one airflow channel. The air fins within the channel have a shape that can be, but not limited to, folded, pin, hexagonal, airfoil, ruffled, herringbone, lanced, louvered, or any combination of these.

In a third aspect of the invention, an integrated cooling system includes a first layer, a plurality of fluid fins, a second layer coupled to the first layer, a plurality of pin and folded air fins, an air-mover, a heat source, a pump, and a programmable controller. The first layer has a first side containing a contact area for coupling a heat source adjacent to it. The first layer contains a fluid path adjacent to the contact area and a heat-transfer area adjacent to the second layer having an area greater than two times the contact area. The fluid path contains a double-counter flow path structure adjacent to at least a portion of the heat source. The first layer has a thermal conductivity of at least 15 W/mK.

The plurality of fluid fins are placed in the flow path over the heat source which includes the double-counter flow path. The fins are evenly spaced and thermally conductive with the first layer contact area, with the fluid in the fluid path, and with the second layer. The fluid fins have a thermal conductivity of at least 15 W/mK.

The air fins coupled to the second layer are covered with an enclosure to create one or more air channels. A channel divider, the air fins shape, and the placement of the air fins control the rate and direction of a cooling airflow.

Preferably, the second layer seals to the first layer to provide an inner surface of the fluid path. In one embodiment, the flow path is optimized to maximize cooling of each electronic device. In another embodiment, the flow path is optimized to minimize the temperature of each electronic device. In yet another embodiment, the flow path is optimized to maximize the cooling of a selected electronic device.

The programmable controller is connected to the air-mover and the pump in a manner where it controls the speed of the pump and air-mover. In one embodiment, the programmable controller controls the pump flow rate and air-mover rate. The programmable controller includes the ability to take temperature measurements from a location on the first layer or second layer assembly. The controller can be integrated with the mother board and use information provided by the chips to control the air movers and pumps. The controller uses the temperature information to control the pump flow rate and the air-mover rate including the state of the pump and air-mover.

In a fourth aspect of the invention, a method of manufacturing an integrated cooling system is disclosed. In the manufacturing method, a first layer is provided with a first side configured with coupling areas for one or more electronic devices and a second side configured to seal with a second layer. The first structure has a fluid path configured to channel fluid from an inlet to an outlet where the fluid path passes over the coupling area for the heat source. Preferably, the flow path contains fluid fins over the coupling areas for the electronic devices. In another embodiment, the flow path has a double-counter flow structure over a coupling area. In another embodiment, the flow path has a microchannel plate assembly.

As another step in the manufacture of the current invention, second layer for circulating a cooling medium is provided and sealed to the first layer. Attached to the second layer is a plurality of air fins. Additionally, all or part of the air fins can be mounted to or formed as an integral part of the second layer.

In another of the manufacturing steps, a pump is coupled to the fluid path forming a closed flow path. In another of the manufacturing steps, a programmable controller is attached to the pump.

Preferably, the seal between second layer and the first layer defines an inner surface of the closed fluid path. In one embodiment, the fluid path contact area between the first and second layer is greater than the contact areas with the electronic devices. Preferably the materials from which the first and second layer are formed have a thermal conductivity of 15 W/(mK) or greater. In some embodiments the programmable controller has a means for measuring a temperature, controlling a fluid flow rate of the pump. Preferably the programmable controller will increase fluid flow rate when the temperature increases and decrease the rate when the temperature drops. In another embodiment, the pump is turned on when the temperature exceeds a specific temperature and turned off when the temperature falls below a specific temperature.

In other embodiments the pump inlet is coupled to the port that has the longest flow-path distance between the port and the highest dissipation heat source.

In another embodiment, a reservoir is coupled to the flow path.

DETAILED DESCRIPTION OF THE PRESENT INVENTION

Embodiments of the present invention are directed to integrated cooling systems in which a liquid-based cold-plate assembly and an air-based heat exchanger (a heat rejector assembly) are configured as an integrated unit. Integrated cooling systems in accordance with the present invention advantageously improve system reliability, improve the ability to cool multiple electronic components with one system, and reduce cost.

In one embodiment of the invention, fluid-cooled and air-cooled heat exchangers are stacked on top of each other, above a heat-generating device, thereby more efficiently cooling the heat-generating device.

In another embodiment, a cooling fluid path includes a double-counter flow structure. In a this structure, the fluid path includes a first segment that "doubles back," or changes direction by 180 degrees along a second segment adjacent to the first. The fluid path then repeats this pattern of doubling back any number of times. In this way, the time in which the fluid flow is adjacent to the heat source is maximized, thus increasing the transfer of heat. Further, the predominant flow direction of the first fluid is counter to that of the flow direction of the second fluid.

In still another embodiment, the system includes a first contact for coupling to a heat source and a second contact area for dissipating heat. Preferably, the second contact area is greater than the first contact area.

Figure 1:
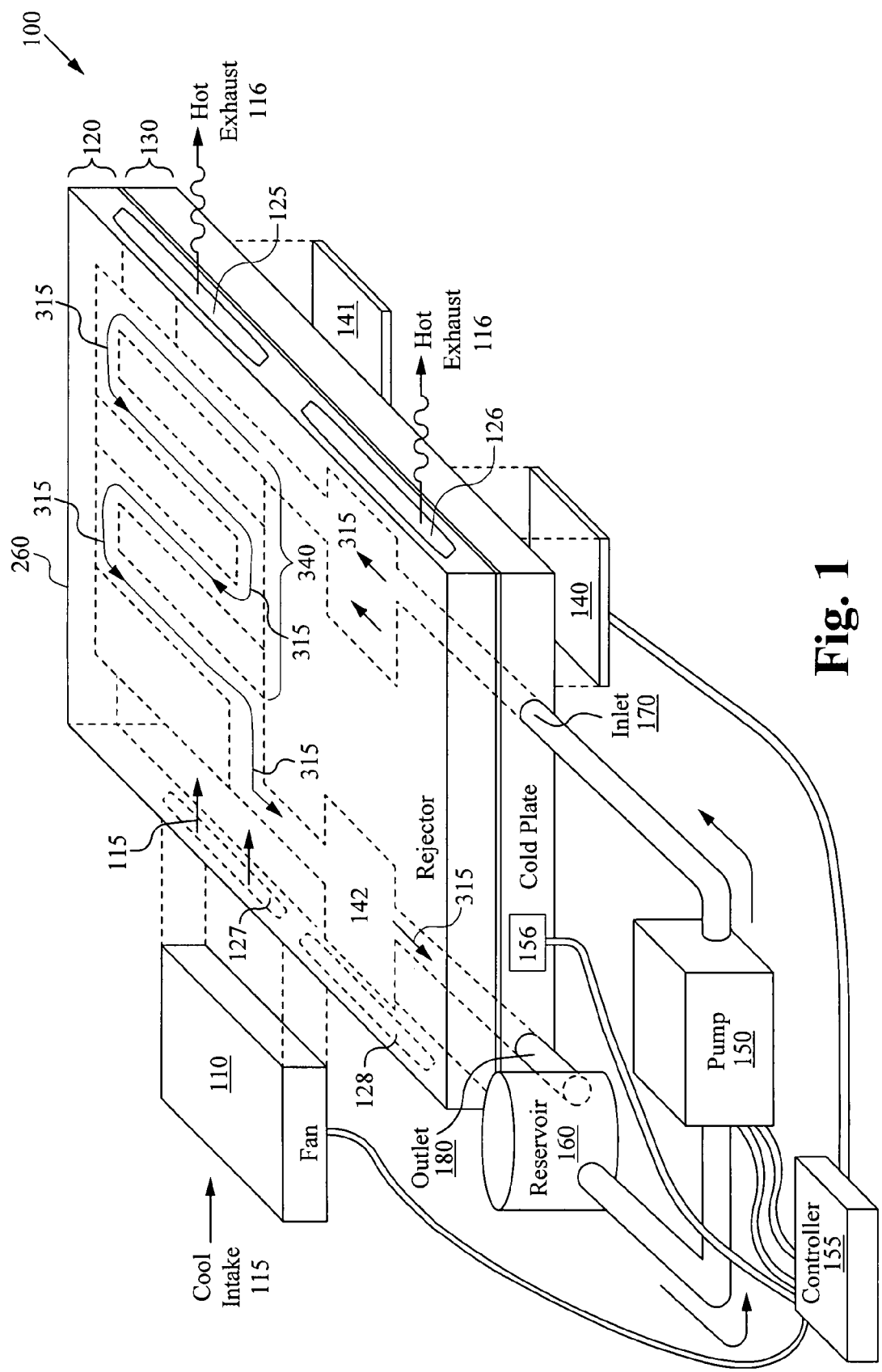
FIG. 1 shows an integrated cooling system, including a heat rejector assembly, according to a first embodiment of the invention.

FIG. 1 is a perspective view of a preferred embodiment of an integrated cooling system 100 for cooling a laptop computer according to a first embodiment of the present invention. The cooling system 100 includes a cold-plate assembly 130 coupled to a heat-rejector assembly 120, thereby forming an integrated cold-plate heat-rejector assembly. One surface of the heat-rejector assembly 120 is adjacent to the cold-plate assembly 130 and forms a top plate and seals to the cold-plate assembly 130. The integrated cold-plate heat-rejector assembly overlies and thus cools first, second, and third electronic devices 140-142, respectively.

The heat-rejector assembly 120 includes air vents 125-127, all fluidly coupled to a cooling fan 110. The cold-plate assembly 130 includes an inlet 170 and outlet 180 fluidly coupled to the flow path 315. Coupled to the inlet 170 and outlet 180 is a pump 150. The pump 150, integrated cold-plate 130 heat-rejector 120 assembly, and reservoir 160 thus form a closed loop fluid path.

The cooling fan 110 generates an airflow 115 entering the vent 127 and passing through the heat-rejector assembly 120.

Additional fans (not shown) can be attached to the heat-rejector assembly 120 and generated additional an air flow through vent 128. The airflow 115 exits the heat-rejector assembly 120 out the vents 125 and 126 as heated exhaust 116. The vents 125, 126 and 127 are preferably formed in the heat-rejector cover 260 and define one or more air channels through the heat-rejector assembly 120.

The fluid path 315 starts with the pump 150 outlet and enters the inlet 170 to the cold-plate assembly 130. The fluid path 315 passes adjacent to a first electronic component 140 where the path 315 has an area over the electronic device 140 that preferably is substantially equal to the coupling area of the device. The fluid path then enters into a double-counter flow structure 340. The double-count flow structure 340 overlies the electronic device 141 and has an area that is preferably substantially larger than the coupling area of the underlying electronic device 141. The path then passes adjacent to a third electronic device 142 where the flow path 315 is sized to have an area greater than the coupling area for the electronic device 142. The flow path 315 exits the cold-plate assembly 130 at the outlet 180. The outlet 180 couples to the reservoir 160 where the reservoir is coupled to the pump 150 inlet. Although FIG. 1 depicts the inlet 170 and outlet 180 originating from the cold-plate assembly, it will be appreciated that the location of the inlet 170 and outlet 180 can be through the heat-reject assembly 120 or any combination of the two.

A controller 155 is coupled to the fan 110, to the pump 150, and to a temperature-sensing element 156. The temperature-sensing element 156 is coupled to and thus monitors a temperature of the cold plate 130. In operation, the controller 155 is programmed to sense the temperature of the cold plate 130 sensed by the temperature-sensing element 156 and, in response, control the pump 150, the fan 110, or both. As one example, when the temperature of the cold plate 130 is above a predetermined threshold value, the controller 155 turns on the pump 150 to thereby cool the cold plate 130, turns on the fan 110 to thereby cool remove heat through the vents 125 and 126, or to turn on both the pump 150 and the fan 110. When the temperature of the cold plate 130 falls below a threshold value, the pump 150, fan 110, or both are turned off. While FIG. 1 depicts the temperature-sensing element 156 coupled to the cold-plate assembly 130, alternatively it can be coupled to the heat-rejector assembly 120 or integrally formed as part of one or more of the electronic chips 140-142.

In operation, the heat sources 140-142 each generate heat that radiates into the cold plate 130. The pump 150 pumps fluid from the reservoir 160, to the inlet 170, along the flow path 315 that includes the double-counter flow structure 340, and to the outlet 180. While above the heat sources 140-142, the fluid absorbs heat conducted from the heat sources 140-142 into the cold plate 130. The heated fluid moves the heat around the cold plate 130 where it is transported to the heat-rejector assembly 120. The heat-rejector assembly 120 then conducts the heat into the air flowing from vents 127 and 128 to the exit vents 125 and 126. The temperature within the cold plate 130 is monitored by the temperature sensing element 156 and used by the controller 155 to control the pump 150, the fan 110, or both.

As described in detail below, heat is removed efficiently by (a) positioning the heat sources 140-142 adjacent to the flow path 315, (b) thermally coupling the electronic devices 140-142 to their respective contact areas, (c) selecting a size of the flow path to correspond to the contact area of a heat source, or (c) selecting a combination of these.

Figure 2:
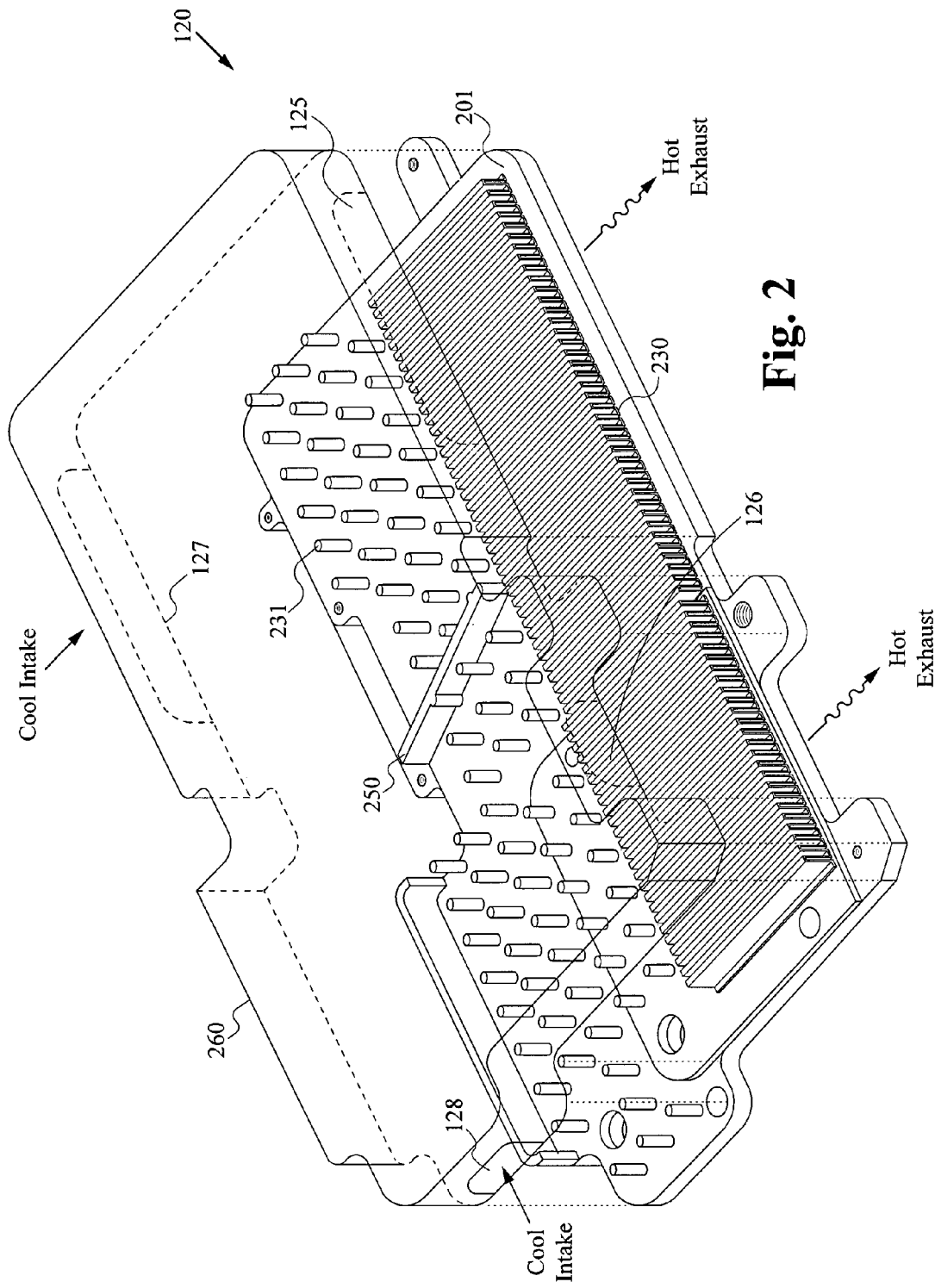
FIG. 2 is an exploded phantom view of the heat rejector assembly of FIG. 1.

FIG. 2 illustrates an exploded phantom view of the heat-rejector assembly 120 (FIG. 1). The base of the heat-rejector assembly 120 consists of a rejector plate 201, folded air fins 230 and pin air fins 231 coupled to the rejector plate 201, an air channel divider 250, and a cover 260 with air intake vents 127 and 128 and exit vents 125 and 126.

The rejector plate 201 forms a fluid tight seal with the cold-plate assembly 130 (FIG. 1). Folded air fins 230 and pin air fins 231 are mounted to the rejector plate 201 or formed as an integral part of the rejector plate 201.

In operation, the cover 260 preferably forms two air channels through the air fins. Air is forced, from the vents 127 and 128 by the fan 110 (FIG. 1) and exits the vents 125 and 126. The folded air fins 230 and pin air fins 231 conduct heat from the rejector plate 201 and into the ambient environment, in this case the air within the air channels. However, air fins cause a back pressure impeding the air flow 115 (FIG. 1). Because more back pressure is caused by the folded air fins 230, they are not used over the entire rejector plate 201. Part of the rejector plate 201 surface has pin air fins 231 attached to the heat-rejector plate 201. These pin air fins 231 function to accomplish the same goal as the folded air fins 230, though less efficiently but causing less back pressure. The pin fins 231 conduct heat from the rejector plate into the ambient environment and control the air flow 115 (FIG. 1) within the air channel.

Figure 3:
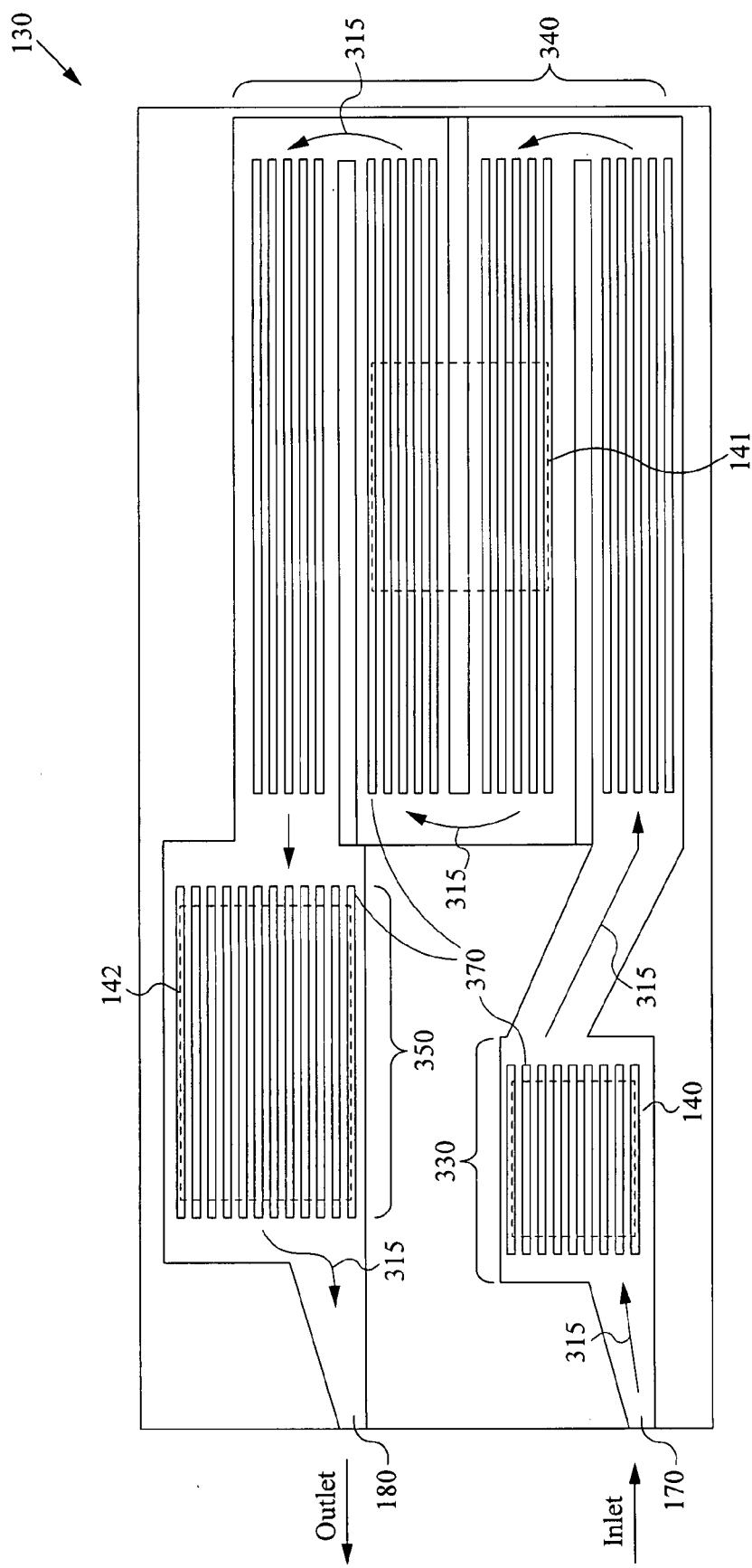
FIG. 3 is a top cross-sectional view of the cold-plate assembly of FIG. 1, showing fluid channels over multiple heat sources.

FIG. 3 illustrates a top view of the preferred embodiment of the cold-plate assembly 130. The cold-plate assembly 130 couples to the heat sources shown in phantom under the cold-plate assembly 130. The heat sources shown represent a CPU 140, a memory hub controller 141, and GPU 142, typical of a laptop design.

The cold-plate assembly contains a fluid path 315 from the inlet 170 through the three flow path structures 330, 340, and 350 and to the outlet 180. The inlet 170 and outlet 180 are coupled to a pump 150 (FIG. 1) and reservoir 160 (FIG. 1) and the flow of fluid through the fluid path 315 is as described above for FIG. 1. More details of the structures 330, 340, and 350 are provided.

The flow path contains three fin structure, 330, 340, and 350. Each of these structures 330, 340 and 350 contains of a set of fluid fins 370 forming flow channels. Within the structures 330, 340, and 350 the fins are substantially parallel and substantially evenly spaced. It will be apparent that other orientations and other spacing are also contemplated. The fluid fins 370 conduct heat from the heat source, into the fluid, and directly to the heat rejector 120 (FIG. 1). The fluid fins 370 provide several functions. First, the fluid fins 370 provide an even flow of fluid across the area adjacent to the heat source. Secondly, the fluid fins 370 provide conduction of heat from the heat source 140, 141, and 142 into the fluid within the fluid path 315. Thirdly, the fluid fins 370 are in thermal contact with the heat-rejector assembly 120 (FIG. 1), then the fluid fins 370 directly conduct heat to the heat rejector assembly, 120 (FIG. 1).

While FIG. 3 shows only one double-counter flow path over the electronic device 141, alternative embodiments of this invention can incorporate additional double-counter flow paths over other heat sources. Further, the scope of this invention covers the use of sequential double-counter flow paths or multiple double-counter flow paths that have parallel flows or multiple double-counter flow paths that are placed in differing orientations. In an alternative embodiment, the fluid fin structure 330 can be a MCP (microchannel plate) assembly. Additionally, alternative embodiments can have fluid paths that pass adjacent to more or fewer heat sources.

Figure 4:
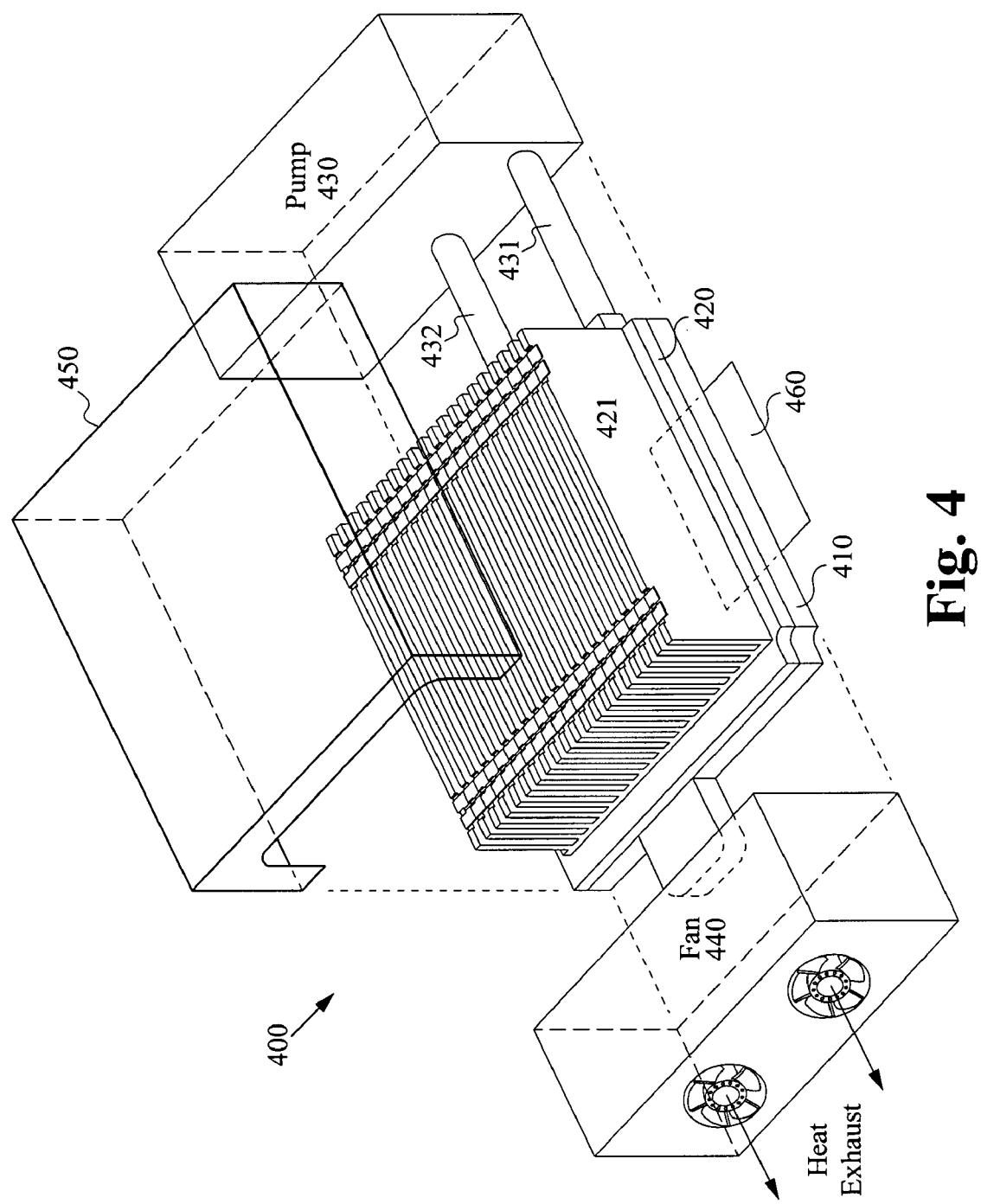
FIG. 4 is a perspective view of an integrated cooling system for a computer card according to a second embodiment of the invention.

FIG. 4 is a perspective view of an integrated cooling system 400 in accordance with a second embodiment of the present invention. The integrated cooling system 400 includes a cold-plate assembly 410, coupled to the heat-rejector assembly 420, a pump 430, and a fan 440. Air-fins 421 are coupled to the heat-rejector assembly 420.

The cold-plate assembly 410 contains a fluid path and fluid which is pumped though the assembly 420 to distribute the heat generated by the heat source 460. The heat-rejector 420 is sealed to the cold-plate and defines an inner surface of the of the fluid path. A pump 430 is coupled to the fluid path though an inlet 431 and an outlet 432. The heat is conducted to the heat-rejector assembly 420, to the air fins 421, and into the ambient air flow generated by the fan 440. Preferably an enclosure 450 covers the heat-rejector assembly 420 forming an air channel. Attached to one end of the air channel is a fan 440 that either pulls or pushes air through the air fins 421.

The pump 430 is any conventional pump, including but not limited to, an electro-osmotic pump and a mechanical pump. The air fins 421 are illustrated as straight air fin but the invention encompasses other air fin designs including but not limited to folded air fins.

Figure 5:
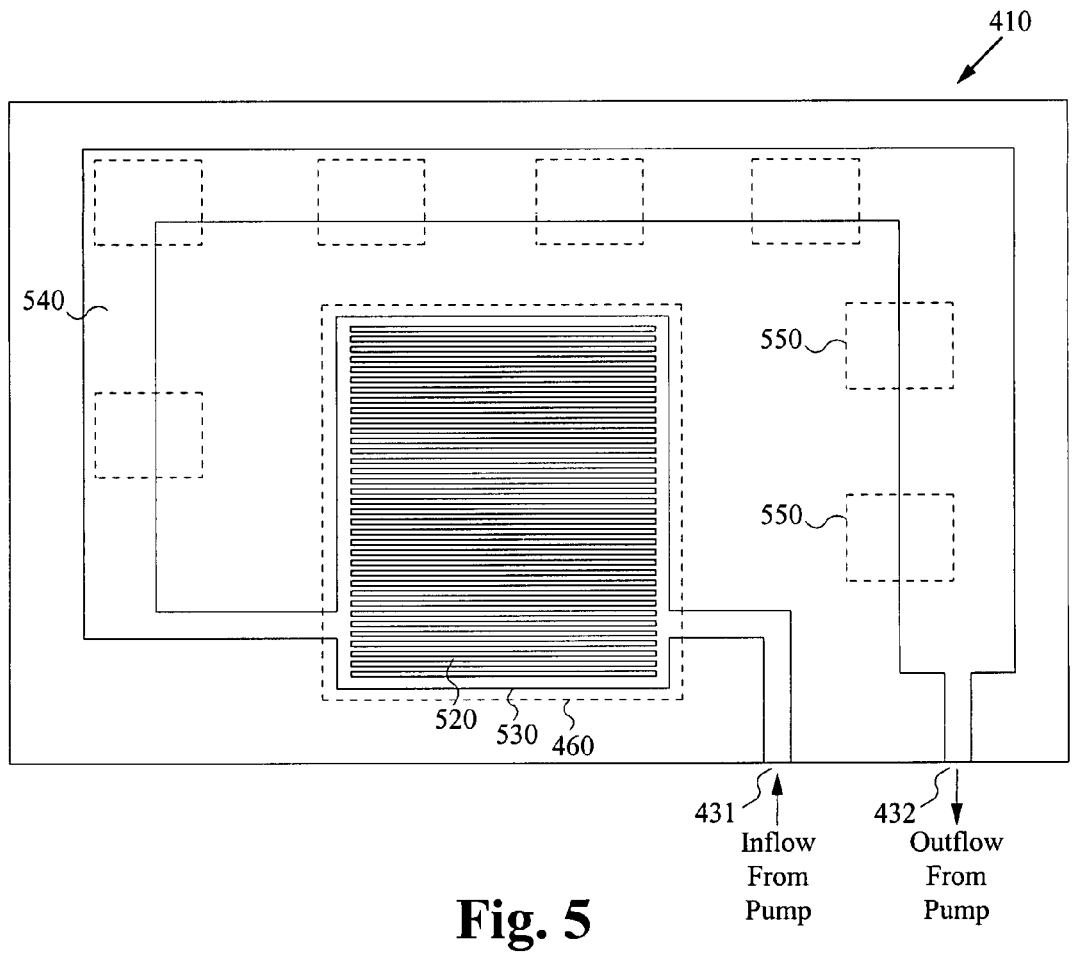
FIG. 5 is a top cross-sectional view of the cold-plate assembly of FIG. 4 showing macro channels and the microchannels for the cooling of a processor and memory chips.

FIG. 5 illustrates a top view of the cold-plate assembly 410 of the second embodiment of the present invention as shown in FIG. 4. The cold-palate assembly 410 contains macro channels 540 and a MPC assembly. Fluid enters the inlet 431 flow and enters the MCP assembly 530. The MCP assembly 530 is situated adjacent to a graphics processor 460 which is thermally coupled with the opposing side of cold-plate assembly 410. The fluid is distributed to flow evenly through the microchannels 520 and then into a macro channel 540. The macro channel 540 follows a path that either is adjacent or partially adjacent to the graphics memory 550 electronics. The graphics memory 550 is either in physical contact with the cold-plate assembly 410 or thermally coupled to the cold-plate assembly 410.

In operation, the fluid, acts to dissipate the conducted heat over a larger area for conduction into the environment, here the area of the heat-rejector assembly 420 (FIG. 4). The fluid exits the cold-plate assembly 420 through the port 432.

While a graphics processor is referenced in this illustration, this invention is applicable to other computer cards such as but not limited to network processor, co-processors and high heat dissipation electronic components.

Figure 6:
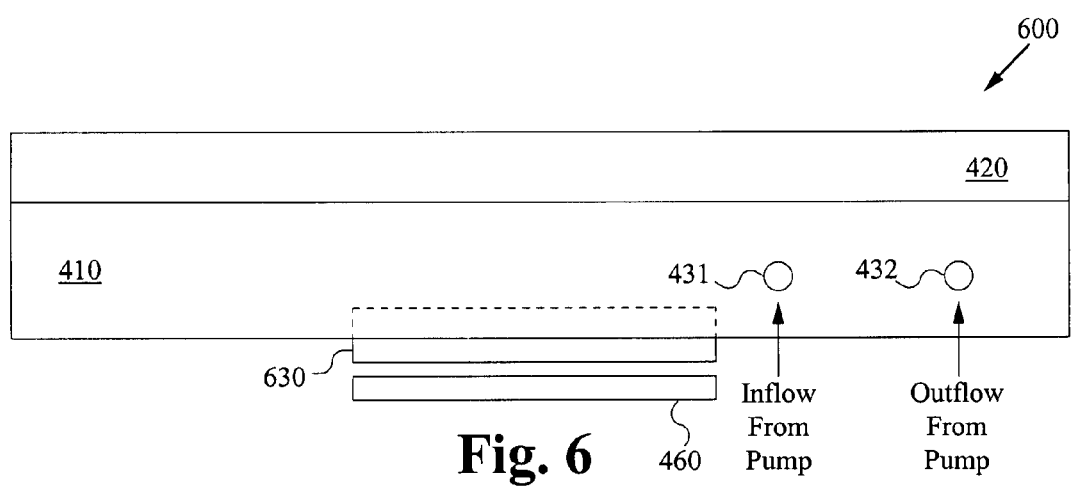
FIG. 6 is a side cross-sectional view of the cold-plate assembly and heat-rejector assembly of FIG. 4 showing a microchannel subassembly joined to macro channel base through a hole in the cold plate.

FIG. 6 illustrates a side view of the cold-plate assembly 410 and assembly 600 in accordance with a second embodiment of the present invention. A heat-rejector assembly 420 is coupled to the cold-plate assembly 410 forming an integrated cold-plate 410 and heat-rejector 420 assembly 600. The cold-plate assembly 410 includes the MCP assembly 630. This MCP assembly 630 is shown coupled to the cold-plate assemble 410 and as part of the fluid path from the pump 430 (FIG. 4) where fluid flows into inlet 431, through the microchannel 630, and exits at the outlet 432, returning to the pump 430 (FIG. 4).

Figure 7:
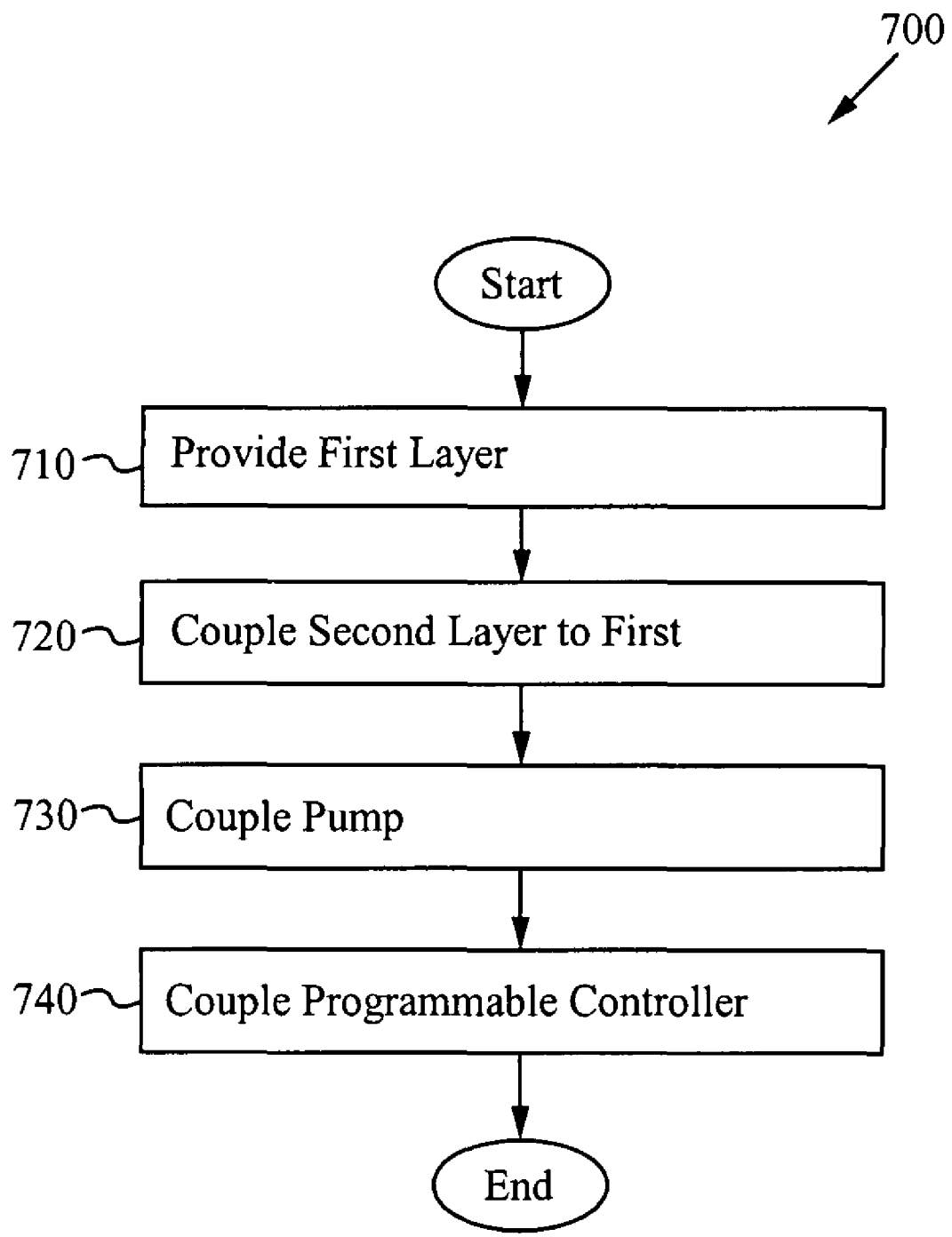
FIG. 7 is a flow chart for fabricating an integrated cooling system in accordance with the present system.

FIG. 7 is a flow chart for the fabrication 700 of the an integrated cooling system. In step 710 a first layer is provide. The first layer has a first side where one or more heat sources are thermally coupled with the first layer forming a contact area.

Preferably, the provided first layer has a thermal conductivity of 15 W/(mK) or greater. The first layer will be formed with a flow path. The flow path can be formed by any method including but not limited to stamping, casting, milling, or chemical etching. Preferably the flow path passes adjacent to the heat sources and is of sufficient size to substantially cover the heat source contact area. Further, as part of the flow path, a double-counter flow path is followed. In another embodiment the flow path does not have a double-counter flow pattern in the flow path.

As part of step 710, the fluid fins are provided in the flow path 315 (FIG. 1). The fluid fins 370 (FIG. 2) provide an even flow of fluid in the areas adjacent to the heat source. Preferably, the fluid fins 370 (FIG. 2) are provided over the areas adjacent to the heat sources contact areas and within the double-counter flow area. Preferably, the fins are in parallel to each other, evenly spaced, and formed out of a thermally conductive material to conduct heat from the heat source contact areas to the fluid. Preferably, the fluid fins are thermally coupled with second layer when the second layer is sealed to the first layer. The fluid fins can be fabricated by machining processes including but not limited to casting, stamping, milling, chemical etching, or any combination thereof. In one embodiment, the fluid path can include a MCP assembly. The MCP structure is preferably formed on a separate structure that is inserted into the flow path through an opening in cold-plate assemble 410 (FIG. 5). The MPC is sealed the first layer by a means not limited to brazing, welding, gluing, or a gasket and a attachment means.

The step 720 provides a second layer that his coupled to the first layer. Preferably, the second layer has a plate that seals to the first layer forming a closed fluid path. As part of the second layer are air fins 230 and 231 (FIG. 2). The air fins can be attached or be formed into the plate 201 (FIG. 2) that seals with the first layer. The air fins 230 and 231 (FIG. 2) can include the types but are not limited to a hexagonal shaped, airfoil shaped, ruffled, herringbone, lanced, louvered, or any combination thereof. Perferably, the thermal conductivity of the air fins 230 and 231 (FIG. 2), the plate 201 (FIG. 2), is 15 W/(mK) or greater. The seal between the cold-plate 120 (FIG. 1) and the heat-rejector 130 (FIG. 1) can be formed by the means not limited to brazing, welding, gluing, or with a gasket. The air fins 230 and 231 (FIG. 2) are coupled by the method not limited to soldering, welding, gluing, or any combination thereof.

In the step 730, a pump 150 (FIG. 1) is provided and coupled to the fluid path 315 (FIG. 1) in the first layer 130 (FIG. 1), 410 (FIG. 4). The pump 150 (FIG. 1) is attached directly to the first layer 130 (FIG. 1), 410 (FIG. 4) or through tubing. In some embodiments, the coupling of the pump 150 (FIG. 1) is through the second layer plate 201 (FIG. 2) that seals to the first layer. The provided pump 150 (FIG. 1) can be but is not limited to an electro-osmotic pump and a mechanical pump.

In step 740, one embodiment includes a programmable controller. The controller includes means for measuring a temperature on either the first layer and the second layer. The programable controller is electrically connected to the fan 110 (FIG. 1) and the pump 150 (FIG. 1).

For all embodiments of the present invention, the type of fluid used in the integrated liquid-based cooling system is preferably water-based. Alternatively, the fluid within the liquid-based cooling system is based on combinations of organic solutions including, but not limited to, propylene glycol, ethanol, ethylene glycol, and isopropanol (IPA). The fluid used in the liquid-based cooling system also preferably exhibits a low freezing temperature and has anti-corrosive characteristics.

While the invention has been described with reference to numerous specific details, one of ordinary skill in the art will recognize that the invention can be embodied in other specific forms without departing from the spirit of the invention. For instance, the figures and description refer to one embodiment without microchannels, replaced with fluid fins. Another embodiment with only fluid fins. However, additional embodiments include different numbers and types of semiconductor devices in various permutations. Hence, in some embodiments only one or two semiconductor devices are present and/or require a heat exchanger for cooling, while in other embodiments more than three semiconductor devices are housed in a single chassis that requires cooling. Thus, one of ordinary skill in the art will understand that the invention is not to be limited by the foregoing illustrative details, but rather is to be defined by the appended claims.

What is claimed is:

1. An integrated cooling system comprising:
   a. a first layer having a first side for coupling to a heat source adjacent to a contact area,
      wherein the first layer has a first port and a second port coupled to a fluid path adjacent to the contact area,
      the fluid path has a heat-transfer area adjacent to a second layer which is greater than the contact area,
      the fluid path is configured to provide a double-counter flow structure including a first segment coupled to a second segment, wherein the second segment is adjacent to the first segment and fluid flow through the first segment is in an opposite direction as fluid flow through the second segment, further wherein the double-counter flow structure is adjacent to at least one electronic device;
   b. a plurality of fluid fins in the first layer fluid path substantially evenly spaced over the contact area;
   c. the second layer sealed to the first layer, thereby defining the fluid path with an inlet and an outlet suitable for pumping the fluid, wherein the second layer is configured with one or more air channels;
   d. a plurality of pin fins and folded fins coupled to a side opposing the first layer, wherein the air fins are within at least one of the one or more air channels;
   e. an air-mover coupled to at least one of the one or more air channels;
   f. the heat source comprising at least one electronic device;
   g. a pump coupled to the fluid path; and
   h. a programmable controller,
      wherein the programmable controller has a means for measuring a temperature, is programmed to increase a fluid flow through the fluid path as a function of an increased temperature, and is programmed to increase an airflow from the air-mover as a function of an increased temperature.

2. A liquid cooling system for a laptop computer, the system comprising:
   a. a first layer having a first side for coupling to a heat source in the laptop computer adjacent to a contact area,
      wherein the first layer has a fluid path adjacent to the contact area, further wherein the fluid path is configured to provide a double-counter flow structure including a first segment coupled to a second segment, wherein the second segment is adjacent to the first segment and fluid flow through the first segment is in an opposite direction as fluid flow through the second segment;
   b. a plurality of fluid fins in the first layer fluid path substantially evenly spaced over the contact area;
   c. a second layer sealed to the first layer, thereby defining the fluid path with an inlet and an outlet suitable for inputting and outputting fluid, wherein the second layer is configured with one or more air channels; and
   d. a plurality of air fins coupled to a side of the second layer sealed to the first layer, wherein the plurality of air fins are within at least one of the one or more air channels.

3. The system of claim 2 further comprising at least one an air-mover coupled to at least one of the one or more air channels.

4. The system of claim 3 further comprising a pump coupled to the fluid path.

5. The system of claim 4 further comprising a programmable controller coupled to the pump and to the at least one air mover, wherein the programmable controller has a means for measuring a temperature, is programmed to increase a fluid flow through the fluid path from the pump as a function of an increased temperature, and is programmed to increase an airflow from the at least one air-mover as a function of the increased temperature.

6. The system of claim 2 wherein the heat source comprises one or more electronic devices.

7. The system of claim 2 wherein the fluid path has a contact area with the second layer which is greater than the contact area of the first layer with the heat source.

8. The system of claim 2 further comprising a fluid reservoir coupled to the pump.

9. The system of claim 2 wherein the plurality of air fins are configured to control an airflow path and a rate of airflow within the airflow path.

10. An integrated cooling system comprising:
    a. a first layer having a first side for coupling to a heat source adjacent to a contact area,
       wherein the first layer has a fluid path adjacent to the contact area, further wherein the fluid path is configured to provide a double-counter flow structure including a first segment coupled to a second segment, wherein the second segment is adjacent to the first segment and fluid flow through the first segment is in an opposite direction as fluid flow through the second segment;
    b. a plurality of fluid fins in the first layer fluid path substantially evenly spaced over the contact area;
    c. a second layer sealed to the first layer, thereby forming an integrated unit within a single housing, wherein the second layer sealed to the first layer defines the fluid path with an inlet and an outlet suitable for inputting and outputting fluid, further wherein the second layer is configured with one or more air channels; and
    d. a plurality of air fins coupled to a side of the second layer sealed to the first layer, wherein the plurality of air fins are within at least one of the one or more air channels.

11. The system of claim 10 further comprising at least one an air-mover coupled to at least one of the one or more air channels.

12. The system of claim 11 further comprising a pump coupled to the fluid path.

13. The system of claim 12 further comprising a programmable controller coupled to the pump and to the at least one air mover, wherein the programmable controller has a means for measuring a temperature, is programmed to increase a fluid flow through the fluid path from the pump as a function of an increased temperature, and is programmed to increase an airflow from the at least one air-mover as a function of the increased temperature.

14. The system of claim 10 wherein the heat source comprises one or more electronic devices.

15. The system of claim 10 wherein the fluid path has a contact area with the second layer which is greater than the contact area of the first layer with the heat source.

16. The system of claim 10 further comprising a fluid reservoir coupled to the pump.

17. The system of claim 10 wherein the plurality of air fins are configured to control an airflow path and a rate of airflow within the airflow path.

* * * * *